US007795606B2

(12) United States Patent
Jin et al.

(10) Patent No.: US 7,795,606 B2
(45) Date of Patent: Sep. 14, 2010

(54) NON-VOLATILE MEMORY CELL WITH ENHANCED FILAMENT FORMATION CHARACTERISTICS

(75) Inventors: Insik Jin, Eagan, MN (US); Yang Li, Shoreview, MN (US); Dadi Setiadi, Edina, MN (US); Song S. Xue, Edina, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 0 days.

(21) Appl. No.: 12/261,137

(22) Filed: Oct. 30, 2008

(65) Prior Publication Data

US 2010/0032636 A1    Feb. 11, 2010

Related U.S. Application Data

(60) Provisional application No. 61/086,374, filed on Aug. 5, 2008.

(51) Int. Cl.
*H01L 29/04* (2006.01)

(52) U.S. Cl. .................... 257/3; 257/E45.002; 438/382

(58) Field of Classification Search .................. 257/2–5, 257/536, E45.002, E45.003; 438/382
See application file for complete search history.

(56) References Cited

U.S. PATENT DOCUMENTS

| 7,208,372 | B2 * | 4/2007 | Hsu et al. .................... 438/257 |
| 7,521,705 | B2 * | 4/2009 | Liu .............................. 257/2 |
| 7,554,144 | B2 * | 6/2009 | Lai et al. ..................... 257/295 |
| 2006/0027893 | A1 * | 2/2006 | Meijer et al. ................. 257/536 |
| 2007/0052001 | A1 | 3/2007 | Ahn et al. |
| 2007/0090444 | A1 * | 4/2007 | Park et al. .................... 257/314 |
| 2008/0203377 | A1 | 8/2008 | Choi et al. |

* cited by examiner

*Primary Examiner*—Mark Prenty
(74) *Attorney, Agent, or Firm*—Campbell Nelson Whipps LLC

(57) ABSTRACT

Method and apparatus for constructing a non-volatile memory cell, such as a modified RRAM cell. In some embodiments, a memory cell comprises a resistive storage layer disposed between a first electrode layer and a second electrode layer. Further in some embodiments, the storage layer has a localized region of decreased thickness to facilitate formation of a conductive filament through the storage layer from the first electrode to the second electrode.

18 Claims, 7 Drawing Sheets

FIG. 6
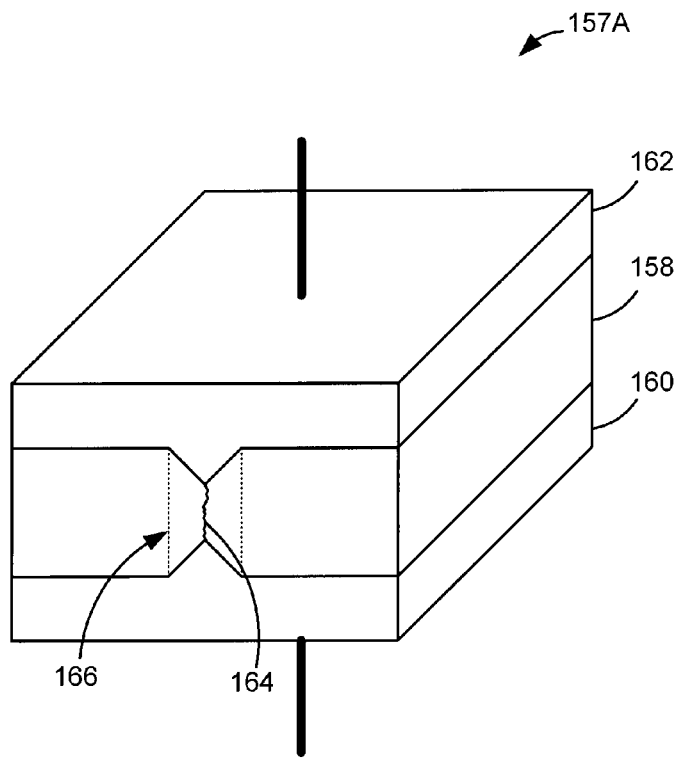
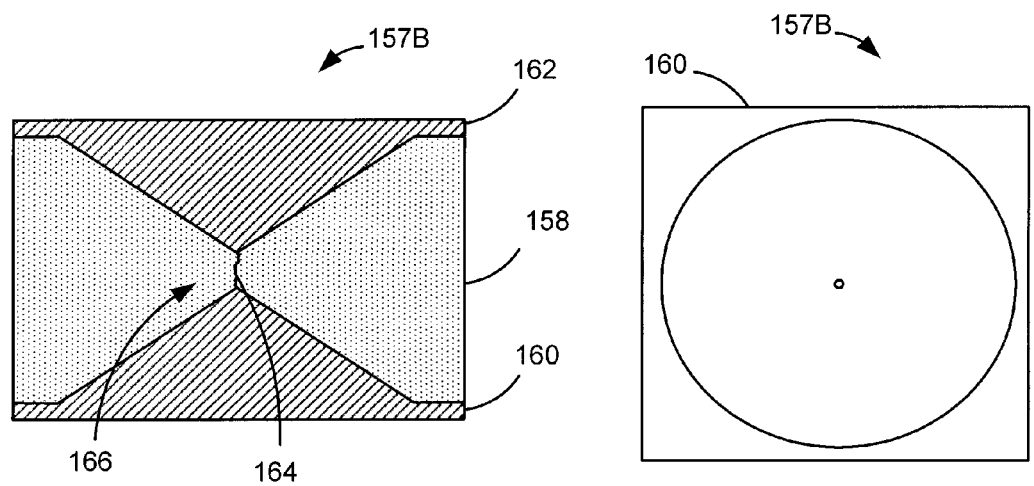
FIG. 7A
FIG. 7B

FIG. 7C
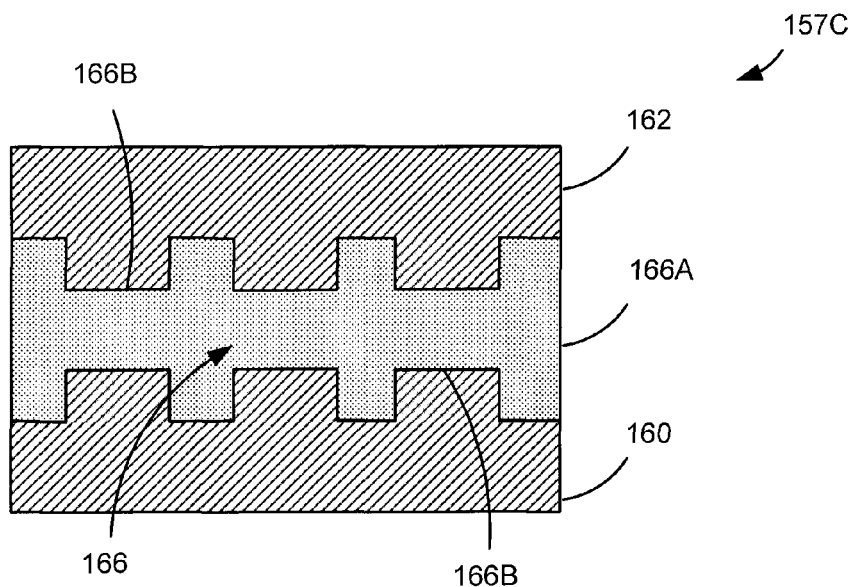
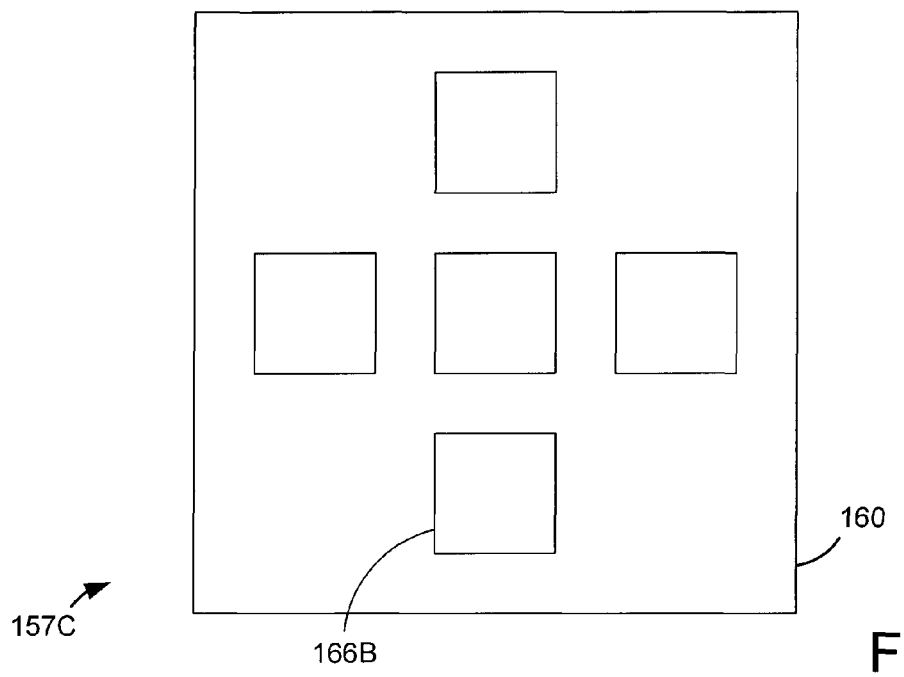
FIG. 7D

FIG. 8
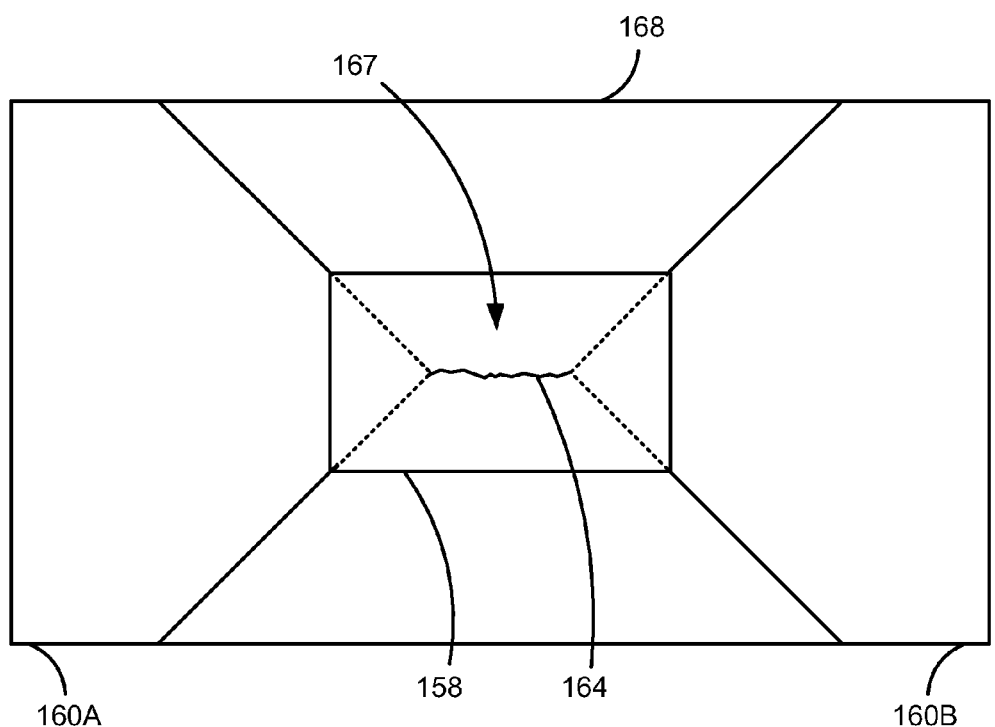
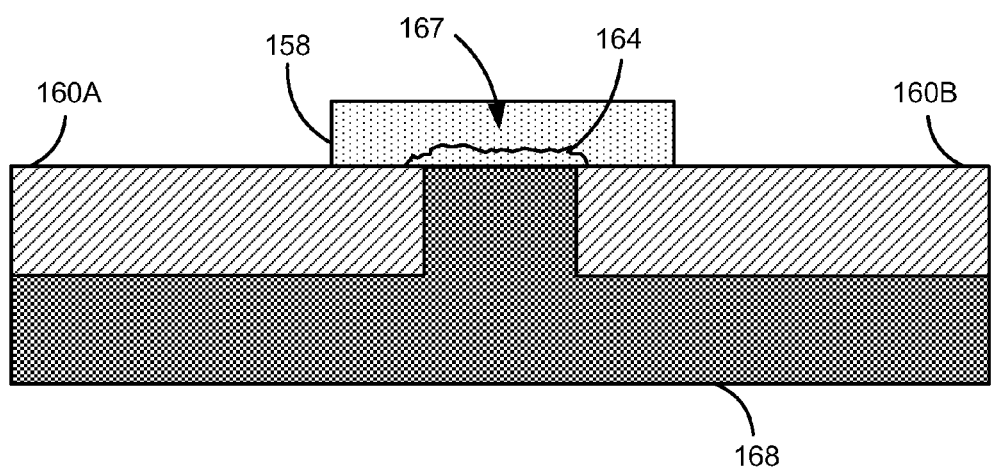
FIG. 9

NON-VOLATILE MEMORY CELL WITH ENHANCED FILAMENT FORMATION CHARACTERISTICS

RELATED APPLICATIONS

This application makes a claim of domestic priority under 35 U.S.C. §119(e) to U.S. Provisional Patent Application No. 61/086,374 filed Aug. 5, 2008.

BACKGROUND

Data storage devices generally operate to store and retrieve data in a fast and efficient manner. Some storage devices utilize a semiconductor array of solid-state memory cells to store individual bits of data. Such memory cells can be volatile (e.g., DRAM, SRAM) or non-volatile (RRAM, STRAM, flash, etc.).

As will be appreciated, volatile memory cells generally retain data stored in memory only so long as operational power continues to be supplied to the device, while non-volatile memory cells generally retain data storage in memory even in the absence of the application of operational power.

In these and other types of data storage devices, it is often desirable to increase efficiency and accuracy during operation, particularly with regard to the reading of data from the storage array.

SUMMARY

Various embodiments of the present invention are generally directed to a method and apparatus for constructing a non-volatile memory cell with improved filament formation characteristics, such as but not limited to a modified RRAM memory cell.

In accordance with various embodiments, a resistive storage layer is disposed between a first electrode layer and a second electrode layer. The resistive storage layer has a localized region of decreased thickness to facilitate formation of a conductive filament through the storage layer from the first electrode to the second electrode.

In other embodiments, a memory cell is formed with a localized region of decreased thickness in a resistive storage layer that is positioned between a first electrode layer and a second electrode layer. The localized region of decreased thickness facilitates formation of a conductive filament through the storage layer from the first electrode to the second electrode.

These and various other features and advantages which characterize the various embodiments of the present invention can be understood in view of the following detailed discussion and the accompanying drawings.

BRIEF DESCRIPTION OF THE DRAWINGS

FIG. 6 displays a memory cell constructed and operated in accordance with the various embodiments of the present invention.

FIGS. 7A, 7B, 7C, and 7D provide an alternative construction to that of FIG. 6.

FIG. 8 shows another alternative memory cell structure in accordance with the various embodiments of the present invention.

FIG. 9 displays a cross-sectional operational view of the alternative memory cell structure of FIG. 8 in accordance with the various embodiments of the present invention.

DETAILED DESCRIPTION

Figure 1:
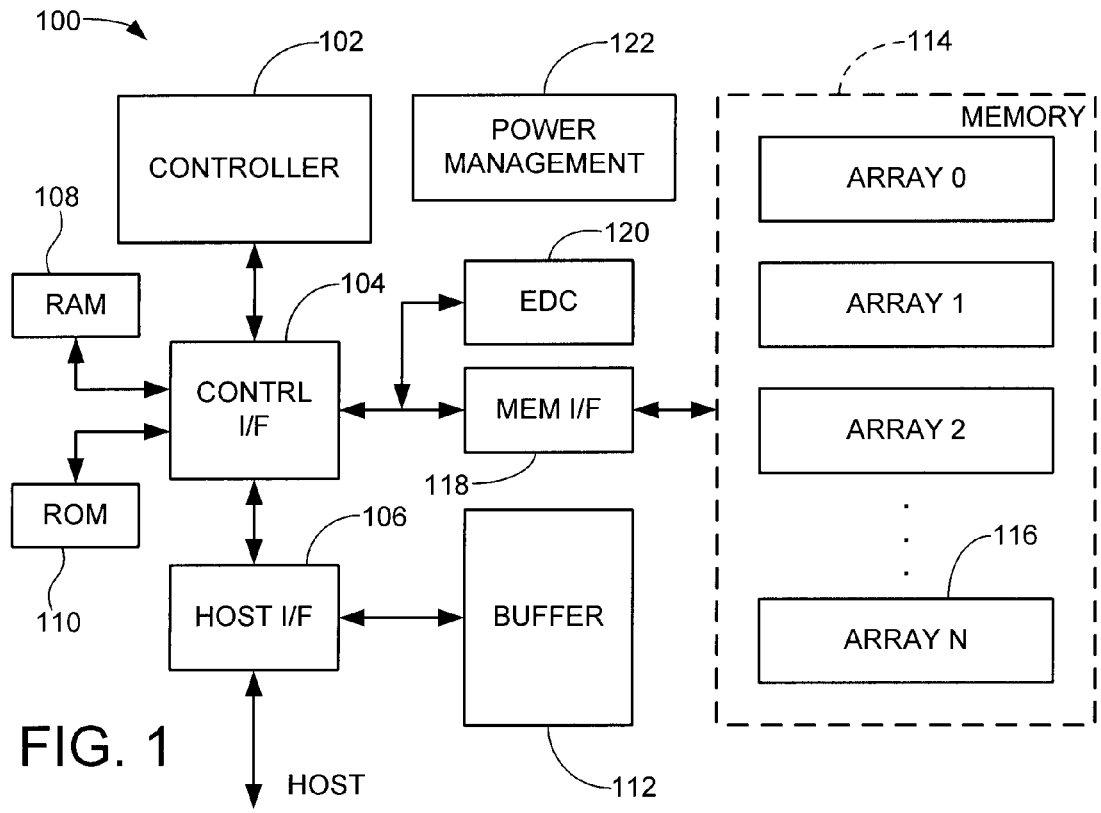
FIG. 1 is a generalized functional representation of an exemplary data storage device constructed and operated in accordance with various embodiments of the present invention.

FIG. 1 provides a functional block representation of a data storage device 100 constructed and operated in accordance with various embodiments of the present invention. The data storage device is contemplated as comprising a portable non-volatile memory storage device such as a PCMCIA card or USB-style external memory device. It will be appreciated, however, that such characterization of the device 100 is merely for purposes of illustrating a particular embodiment and is not limiting to the claimed subject matter.

Top level control of the device 100 is carried out by a suitable controller 102, which may be a programmable or hardware based microcontroller. The controller 102 communicates with a host device via a controller interface (I/F) circuit 104 and a host I/F circuit 106. Local storage of requisite commands, programming, operational data, etc. is provided via random access memory (RAM) 108 and read-only memory (ROM) 110. A buffer 112 serves to temporarily store input write data from the host device and readback data pending transfer to the host device.

A memory space is shown at 114 to comprise a number of memory arrays 116 (denoted Array 0-N), although it will be appreciated that a single array can be utilized as desired. Each array 116 comprises a block of semiconductor memory of selected storage capacity. Communications between the controller 102 and the memory space 114 are coordinated via a memory (MEM) I/F 118. As desired, on-the-fly error detection and correction (EDC) encoding and decoding operations are carried out during data transfers by way of an EDC block 120.

While not limiting, in some embodiments the various circuits depicted in FIG. 1 are arranged as a single chip set formed on one or more semiconductor dies with suitable encapsulation, housing and interconnection features (not separately shown for purposes of clarity). Input power to operate the device is handled by a suitable power management circuit 122 and is supplied from a suitable source such as from a battery, AC power input, etc. Power can also be supplied to the device 100 directly from the host such as through the use of a USB-style interface, etc.

Any number of data storage and transfer protocols can be utilized, such as logical block addressing (LBAs) whereby data are arranged and stored in fixed-size blocks (such as 512 bytes of user data plus overhead bytes for ECC, sparing, header information, etc). Host commands can be issued in terms of LBAs, and the device 100 can carry out a corresponding LBA-to-PBA (physical block address) conversion to identify and service the associated locations at which the data are to be stored or retrieved.

Figure 2:
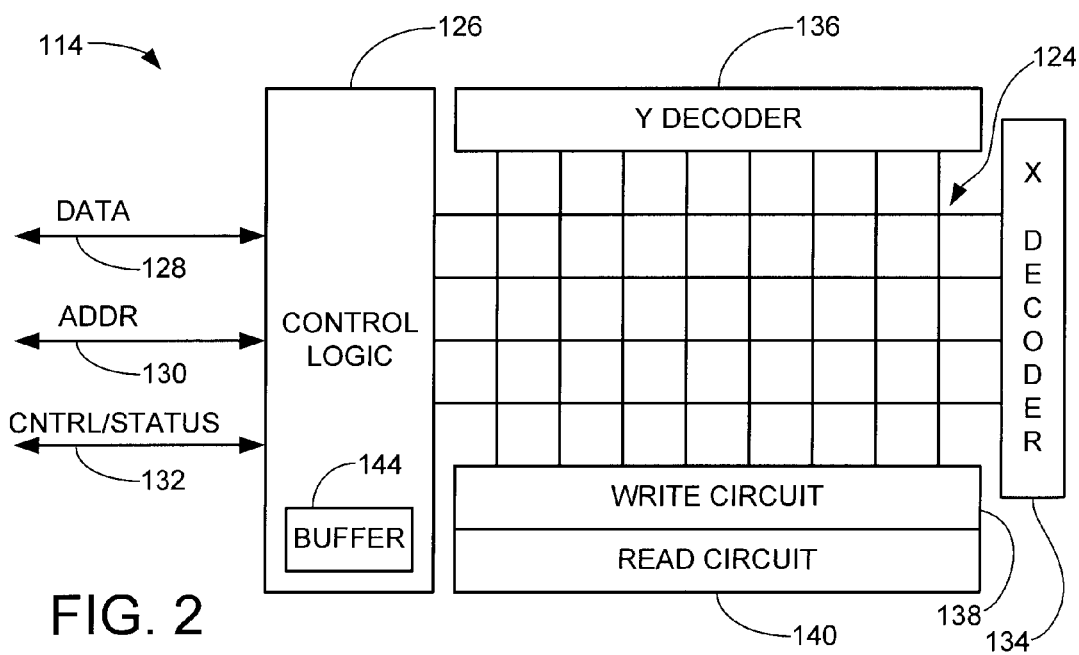
FIG. 2 shows circuitry used to read data from and write data to a memory array of the device of FIG. 1.

FIG. 2 provides a generalized representation of selected aspects of the memory space 114 of FIG. 1. Data are stored as an arrangement of rows and columns of memory cells 124, accessible by various row (word) and column (bit) lines. The actual configurations of the cells and the access lines thereto will depend on the requirements of a given application. Generally, however, it will be appreciated that the various control lines will generally include enable lines that selectively enable and disable the respective writing and reading of the value(s) of the individual cells.

Control logic 126 receives and transfers data, addressing information and control/status values along multi-line bus paths 128, 130 and 132, respectively. X and Y decoding circuitry 134, 136 provide appropriate switching and other functions to access the appropriate cells 124. A write circuit 138 represents circuitry elements that operate to carry out write operations to write data to the cells 124, and a read circuit 140 correspondingly operates to obtain readback data from the cells 124. Local buffering of transferred data and other values can be provided via one or more local registers 144. At this point it will be appreciated that the circuitry of FIG. 2 is merely exemplary in nature, and any number of alternative configurations can readily be employed as desired depending on the requirements of a given application.

Figure 3:
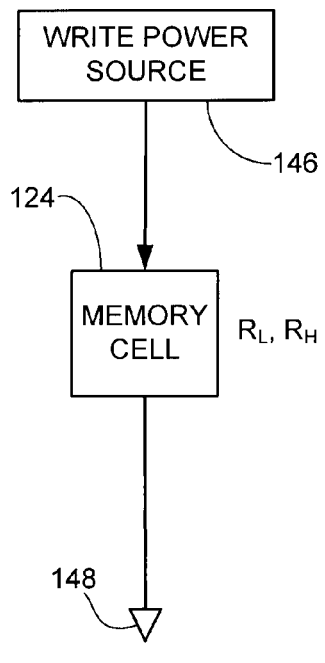
FIG. 3 generally illustrates a manner in which data can be written to a memory cell of the memory array.

Data are written to the respective memory cells 124 as generally depicted in FIG. 3. Generally, a write power source 146 applies the necessary input (such as in the form of current, voltage, magnetization, etc.) to configure the memory cell 124 to a desired state. It can be appreciated that FIG. 3 is merely a representative illustration of a bit write operation. The configuration of the write power source 146, memory cell 124, and reference node 148 can be suitably manipulated to allow writing of a selected logic state to each cell.

As explained below, in some embodiments the memory cell 124 takes a modified RRAM configuration, in which case the write power source 146 is characterized as a current driver connected through a memory cell 124 to a suitable reference node 148, such as ground. The write power source 146 provides a stream of power that is spin polarized by moving through a magnetic material in the memory cell 124. The resulting rotation of the polarized spins creates a torque that changes the magnetic moment of the memory cell 124.

Depending on the magnetic moment, the cell 124 may take either a relatively low resistance ($R_L$) or a relatively high resistance ($R_H$). While not limiting, exemplary $R_L$ values may be in the range of about 100 ohms ($\Omega$) or so, whereas exemplary $R_H$ values may be in the range of about 100 K$\Omega$ or so Other resistive memory type configurations (e.g., RRAMs) are supplied with a suitable voltage or other input to similarly provide respective $R_L$ and $R_H$ values. These values are retained by the respective cells until such time that the state is changed by a subsequent write operation. While not limiting, in the present example it is contemplated that a high resistance value ($R_H$) denotes storage of a logical 1 by the cell 124, and a low resistance value ($R_L$) denotes storage of a logical 0.

Figure 4:
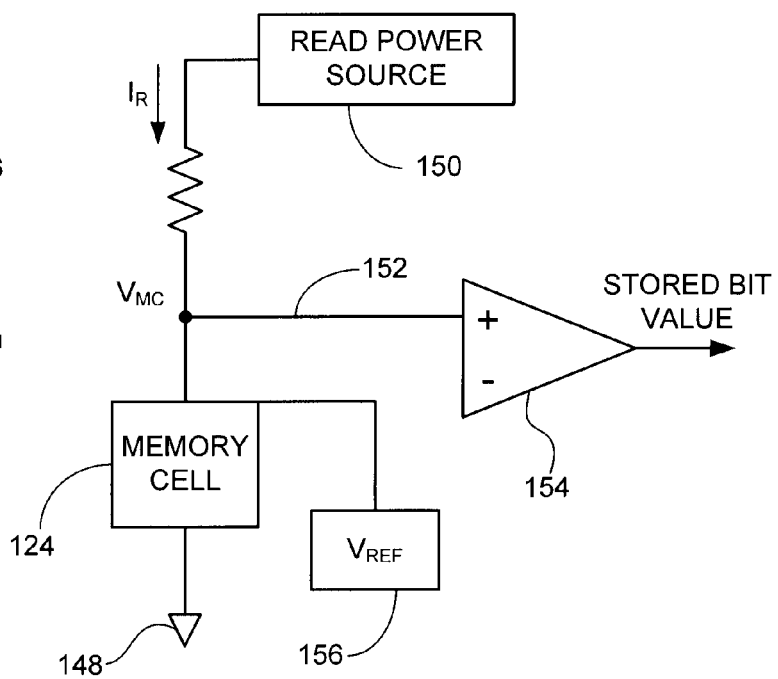
FIG. 4 generally illustrates a manner in which data can be read from the memory cell of FIG. 3.

The logical bit value(s) stored by each cell 124 can be determined in a manner such as illustrated by FIG. 4. A read power source 150 applies an appropriate input (e.g., a selected read voltage) to the memory cell 124. The amount of read current $I_R$ that flows through the cell 124 will be a function of the resistance of the cell ($R_L$ or $R_H$, respectively). The voltage drop across the memory cell (voltage $V_{MC}$) is sensed via path 152 by the positive (+) input of a comparator (sense amplifier) 154. A suitable reference (such as voltage reference $V_{REF}$) is supplied to the negative (−) input of the comparator 154 from a reference source 156.

The voltage reference $V_{REF}$ can be selected from various embodiments such that the voltage drop $V_{MC}$ across the memory cell 124 will be lower than the $V_{REF}$ value when the resistance of the cell is set to $R_L$, and will be higher than the $V_{REF}$ value when the resistance of the cell is set to $R_H$. In this way, the output voltage level of the comparator 154 will indicate the logical bit value (0 or 1) stored by the memory cell 124.

Figure 5:
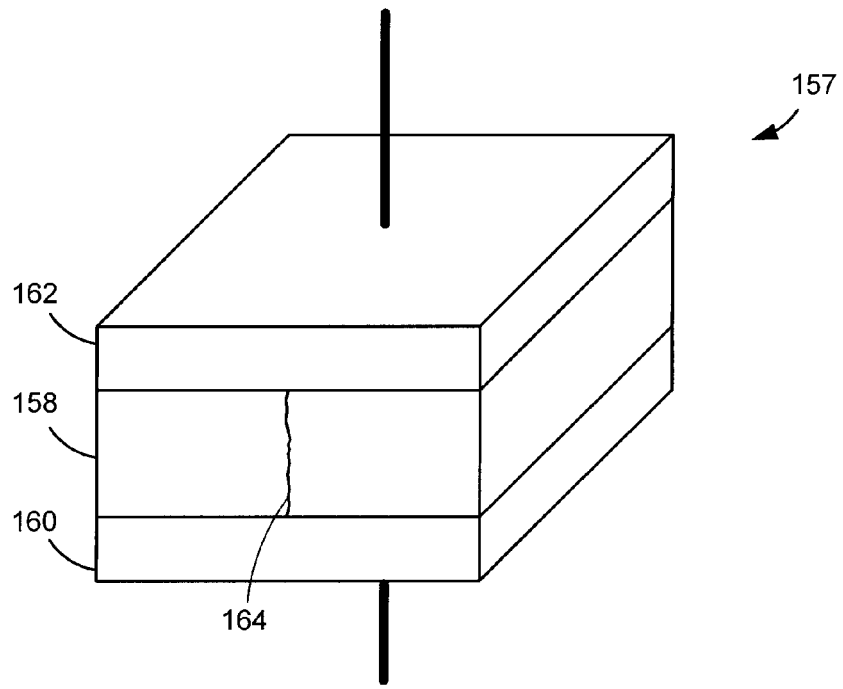
FIG. 5 shows a filament-based memory cell.

FIG. 5 generally illustrates a conventional filament-based memory cell 157, which may be characterized as an RRAM cell as discussed above. A resistive storage layer 158 is disposed between a bottom electrode layer 160 and a top electrode layer 162. The memory cell has a naturally high resistive value due to the composition and properties of the storage layer 158, which can be an oxide (such as magnesium oxide, MgO) with normally high electrical resistance.

However, a low resistive value is created when a predetermined write voltage of selected polarity is applied across the cell 157 so that an amount of current passes through the storage layer 158 and one or more filaments 164 are formed therein to electrically interconnect the top electrode layer 162 and the bottom electrode layer 160. The filament formation process will generally depend on the respective compositions of the layers, but generally, a filament such as 164 can be formed through the controlled metal migration (e.g., Ag, etc.) from a selected electrode layer into the oxide storage layer.

The subsequent application of a voltage of opposite polarity across the cell 157 will generally drive the metal from the storage layer 157 back into the associated electrode layer 160 or 162, removing the filament 164 from the cell and returning the cell to the initial high resistance state. The reading of the filament-based cell 157 with distinctive high and low resistance states can be carried out as described by FIG. 4.

A memory cell 157A constructed and operated in accordance with various embodiments of the present invention is shown in FIG. 6. The memory cell 157A is generally similar in overall construction and operation to the memory cell 157 of FIG. 6, except as detailed below.

Generally, the memory cell 157A has a localized region of decreased thickness to facilitate formation of a conductive filament through the storage layer. A resistive storage layer 158 is disposed between a bottom electrode layer 160 and a top electrode layer 162. The localized area of decreased thickness is denoted at 166 and effectively shortens the length of any filament that forms to connect the electrode layers 160 and 162. The shortened filament requirement allows for smaller required write current as well as optimized power consumption during read operations.

It will be appreciated that the decreased thickness 166 of the intermediate storage area 158 corresponds to localized increases in the associated thicknesses (projections) of the electrode layers 160 and/or 162. With a predetermined amount of current flowing through the cell, a filament 164 has electrically connected the top electrode layer 162 with the bottom electrode layer 160 and effectively lowered the resistance of the memory cell in the process.

It should be noted that the layers and connections shown herein do not denote the only possible formations capable of operating in accordance with the embodiments of the present invention. In fact, the various layers can be limited to predetermined areas or not extend the complete dimensions of the memory cell. In configuring a given cell with a reduced storage layer thickness as discussed herein, it may be desirable to ensure that the cell retains adequate high electrical resistance in the non-filament state sufficient to provide low leakage current and reliable resistance sensing levels are obtained.

A cross-sectional view of an alternative memory cell structure 157B is shown in FIG. 7A. The structure 157B is generally similar to the structure 157A and similar reference numerals are used for both structures. A top plan view of the bottom electrode layer 160 of FIG. 7A is shown in FIG. 7B.

FIG. 7C provides a cross-sectional view of an alternative memory cell structure 157B. The structure 157C is generally similar to the structure 157A and similar reference numerals are used for both structures. In FIG. 7C, a plurality of reduced thickness areas 166A in storage layer 158 are formed between respective pairs of opposing projections 166B, 166C in respective electrode layers 160, 162. A top plan view of the bottom electrode layer 160 is shown in FIG. 7D to denote one possible pattern of said projections 166B. It is contemplated that filaments may be formed between all or less than all of the respective sets of projections in a given write operation.

In other embodiments, different localized thicknesses of the storage layer 158 can be used as desired, such as but not limited to, greater thicknesses in one area (such as in a medial extent of the cell) and lesser thicknesses in other areas (such as near a boundary of the cell). Other alternative configurations will readily occur to the skilled artisan in view of the present discussion.

Another alternative memory cell structure is generally represented at 157D in FIG. 8. A resistive storage layer 158 is disposed between two sides of a bottom electrode layer 160A and 160B. The structure 157D is generally similar to the structure 157A and similar reference numerals are used for both structures. The electrode layers are configured to provide a localized region of decreased connection length 167 that shortens the required length a filament 164 needed to connect the electrode layers. The localized region of decreased connection length 167 is adjacent to the sides of the bottom electrode layer 160A and 160B as well as an insulating layer 168.

Furthermore, the insulating layer 168 extends below the electrode layer 160A and 160B as shown by the cross-sectional view of FIG. 9. The filament 164 is optimally formed in the localized region of decreased connection length 167 of the resistive storage layer 158, as shown. The existence of an electrical path from one side of the bottom electrode layer 160A to the opposing side of the bottom electrode layer 160B creates a low resistance value for the memory cell that can be read as a logical state by a read operation of FIG. 4.

Figure 10A:
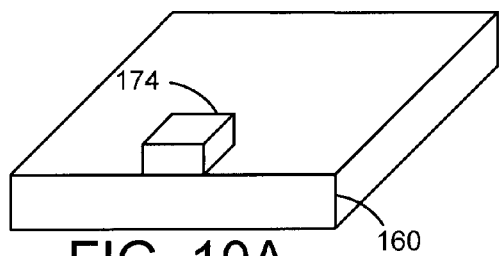
FIG. 10A generally illustrates a sequence of constructing a memory cell in accordance with various embodiments of the present invention.

A manufacturing procedure to form a memory cell operated in accordance with the various embodiments of the present invention is generally illustrated in FIGS. 10A-10F. Initially, a bottom electrode layer 160 is formed and a predetermined amount of hard mask material 174 is formed at a predetermined location on the electrode layer, as shown in FIG. 10A. It can be appreciated that the hard mask material 174 can comprise a variety of compositions and physical configurations. The hard mask material 174 can include, but is not limited to, a diamond-like carbon. In addition, the hard mask material 174 can be formed anywhere on the bottom electrode layer 160 and does not necessarily have to extend to any outside dimension of the electrode layer.

Figure 10B:
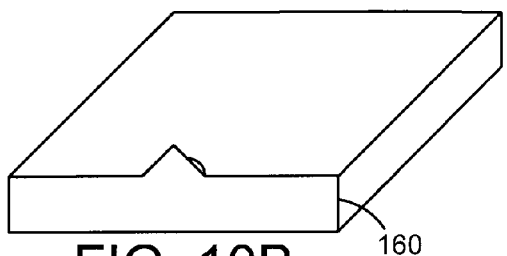
FIG. 10B displays of constructing a memory cell in accordance with various embodiments of the present invention.

FIG. 10B displays the bottom electrode layer 160 after undergoing an ion milling process to shape one half of a localized region of decreased thickness 166. Alternatively, ion milling can be substituted for reactive ion beam etching (RIBE) or inductively coupled plasma (ICP) etching to create a predetermined shape of the localized region of decreased thickness 166. In addition, various shapes can be milled or etched to create a localized region of decreased thickness including, but not limited to, intersecting lines, curvilinear lines, and conical dimensions.

Figure 10C:
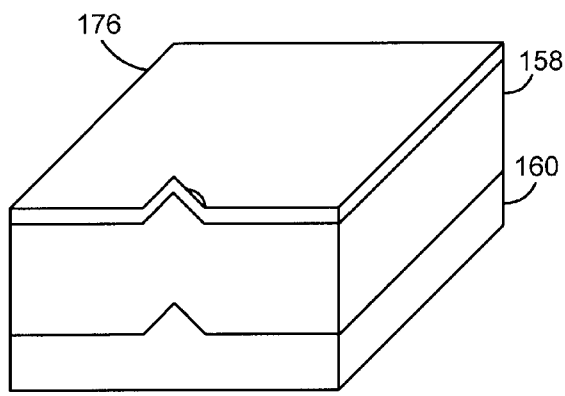
FIG. 10C shows of constructing a memory cell in accordance with various embodiments of the present invention.

FIG. 10C shows the deposition of the resistive storage layer 158 adjacent to the bottom electrode layer 160. Subsequently, a second hard mask layer 176 is deposited onto the resistive storage layer 158. Both the resistive storage layer 158 and the second hard mask layer 176 take the shape of the bottom electrode layer 160.

Figure 10D:
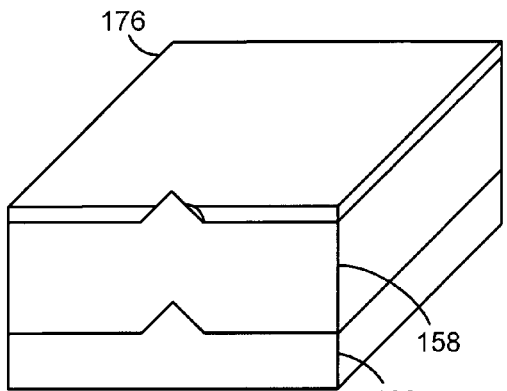
FIG. 10D generally illustrates of constructing a memory cell in accordance with various embodiments of the present invention.

A second ion milling operation is performed on the second hard mask layer 176 to at least partially expose a portion of the resistive storage layer 158 is displayed in FIG. 10D. In some embodiments, the exposed section of the resistive storage layer 158 is the area with the largest elevation. Further in some embodiments, the entire second hard mask layer 176 is milled or etched to a reduced thickness.

Figure 10E:
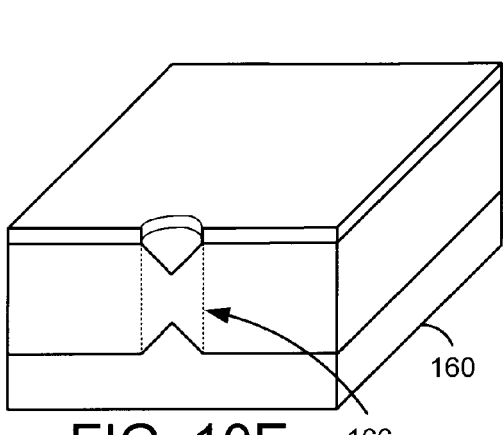
FIG. 10E displays of constructing a memory cell in accordance with various embodiments of the present invention.

FIG. 10E shows a third ion milling operation to create a localized area of decreased thickness 166 in the resistive storage layer 158. The ion milling operation can be substituted for RIBE or ICP etching to remove sections of the second hard mask layer 176 and resistive storage layer 158. While the third ion milling procedure can form a shape of the localized region of decreased thickness that mirrors the bottom electrode layer 160, a unique shape can alternatively be milled or etched in the resistive storage layer 158.

Figure 10F:
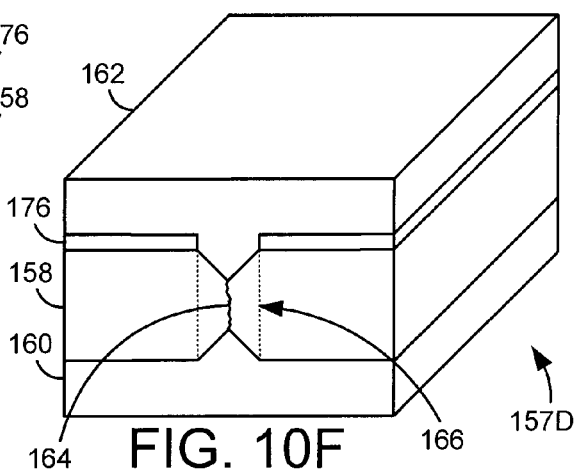
FIG. 10F shows of constructing a memory cell in accordance with various embodiments of the present invention.

FIG. 10F displays a completed memory cell 157D after the deposition of a top electrode layer 162 adjacent to the second hard mask layer 176 and the resistive storage layer 158. Further when a predetermined amount of current is applied to the memory cell, a filament 164 forms to connect the top electrode layer 162 to the bottom electrode layer 160 and provide a low resistance state.

Figure 11:
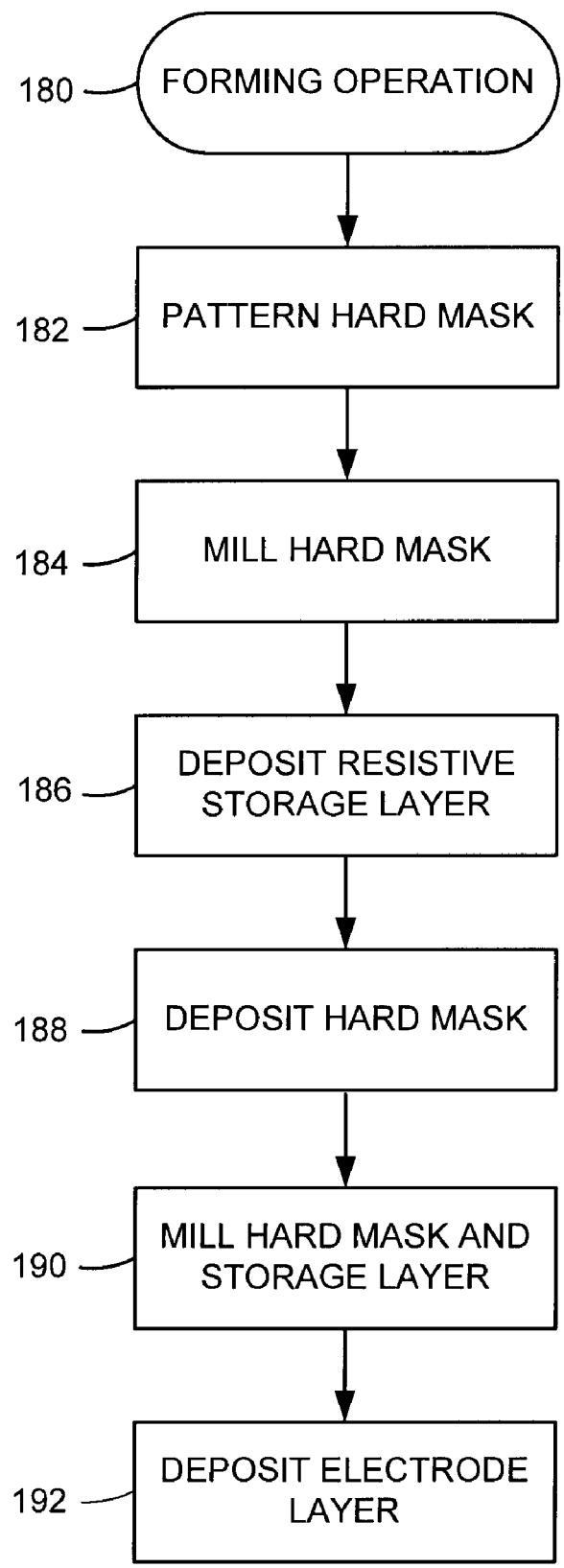
FIG. 11 displays a flow diagram of a forming operation in accordance with the various embodiments of the present invention.

A flow diagram of a forming operation 180 performed in accordance with the various embodiments of the present invention is shown in FIG. 11. A hard mask is first patterned on the bottom electrode layer 160 at step 182. The deposited hard mask is then milled to a predetermined shape that becomes part of the bottom electrode layer in step 184. In step 186, the resistive storage layer 158 is deposited adjacent to the bottom electrode layer 160. Further, a second hard mask layer 176 is deposited onto the resistive storage layer 158 at step 188. The second hard mask layer 176 and resistive storage layer 158 undergo a milling operation to form a localized region of decreased thickness 166 in the resistive storage layer 158 at step 190. Finally at step 192, the top electrode layer 162 is deposited adjacent to the second hard mask layer 176 and the resistive storage layer 158 to form a shortened distance from the top electrode layer 162 to the bottom electrode layer 160.

As can be appreciated by one skilled in the art, the various embodiments illustrated herein provide advantages in both memory cell efficiency and complexity. The ability to use smaller write currents and/or write voltages can provide reduced overall power consumption for an array of memory cells. Moreover, the simplicity of manufacturing operations for the embodiments of the present invention allows for improved memory device structure with decreased numbers of errors. However, it will be appreciated that the various embodiments discussed herein have numerous potential applications and are not limited to a certain field of electronic media or type of data storage devices.

It is to be understood that even though numerous characteristics and advantages of various embodiments of the present invention have been set forth in the foregoing description, together with details of the structure and function of various embodiments of the invention, this detailed description is illustrative only, and changes may be made in detail, especially in matters of structure and arrangements of parts within the principles of the present invention to the full extent indicated by the broad general meaning of the terms in which the appended claims are expressed.

What is claimed is:

1. An apparatus comprising a resistive storage layer disposed between a first electrode layer and a second electrode layer, the storage layer having a localized region of decreased thickness to facilitate formation of a conductive filament through the storage layer from the first electrode to the second electrode, wherein a hard mask is disposed between an electrode layer and the storage layer.

2. The apparatus of claim 1, wherein the storage layer has a plurality of localized regions of decreased thickness.

3. The apparatus of claim 1, wherein the hard mask comprises a diamond-like carbon material.

4. The apparatus of claim 1, wherein at least one section of the localized region of decreased thickness is formed by ion milling.

5. The apparatus of claim 1, wherein at least one section of the localized region of decreased thickness is formed by reactive ion beam etching.

6. The apparatus of claim 1, wherein at least one section of the localized region of decreased thickness is formed by inductively coupled plasma.

7. The apparatus of claim 1, wherein at least one section of the localized region of decreased thickness is formed by sputter-etching.

8. The apparatus of claim 1, wherein each memory cell in a semiconductor memory array is characterized as a resistive random access memory (RRAM) cell.

9. The apparatus of claim 1, wherein each memory cell in a semiconductor memory array is characterized as a phase change random access memory (PC-RAM) cell.

10. A method comprising:

forming a memory cell comprising a resistive storage layer disposed between a first electrode layer and a second electrode layer, wherein the storage layer has a localized region of decreased thickness to facilitate formation of a conductive filament through the storage layer from the first electrode to the second electrode, wherein a hard mask is disposed between an electrode layer and the storage layer.

11. The method of claim 10, wherein the memory cell has a plurality of localized regions of decreased thickness.

12. The method of claim 10, wherein the hard mask comprises a diamond-like carbon material.

13. The method of claim 10, wherein at least one section of the localized region of decreased thickness is formed by ion milling.

14. The method of claim 10, wherein at least one section of the localized region of decreased thickness is formed by reactive ion beam etching.

15. The method of claim 10, wherein at least one section of the localized region of decreased thickness is formed by inductively coupled plasma.

16. The method of claim 10, wherein at least one section of the localized region of decreased thickness is formed by sputter-etching.

17. The method of claim 10, wherein each memory cell in a semiconductor memory array is characterized as a resistive random access memory (RRAM) cell.

18. The method of claim 10, wherein each memory cell in a semiconductor memory array is characterized as a phase change random access memory (PC-RAM) cell.

* * * * *